US 6,747,877 B2

(12) United States Patent
Tonozuka (10) Patent No.: US 6,747,877 B2
(45) Date of Patent: Jun. 8, 2004

(54) ELECTRONIC APPARATUS

(75) Inventor: Kazutoshi Tonozuka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/322,478

(22) Filed: Dec. 19, 2002

(65) Prior Publication Data

US 2003/0111939 A1 Jun. 19, 2003

(30) Foreign Application Priority Data

Dec. 19, 2001 (JP) ........................................ 2001-386042

(51) Int. Cl.⁷ ............................... H05K 7/14; H05K 7/18
(52) U.S. Cl. ...................... 361/797; 361/752; 361/686; 361/740; 361/816
(58) Field of Search ................................ 361/797, 752, 361/800, 816, 684, 685, 686, 759, 740, 732, 726, 747, 818

(56) References Cited

U.S. PATENT DOCUMENTS 6,377,451 B1 * 4/2002 Furuya ........................ 361/686

6,563,714 B2 * 5/2003 Chang ........................ 361/752

FOREIGN PATENT DOCUMENTS

| CH | 633 669 A | 12/1982 |
| JP | 08-018259 | 1/1996 |

OTHER PUBLICATIONS

Patent Abstracts of Japan, vol. 1996, No. 5, May 31, 1996 & JP 08 018259 A (NEC Eng. Ltd.), Jan. 19, 1996 (abstract).

* cited by examiner

*Primary Examiner*—David Martin
*Assistant Examiner*—Hung Bui
(74) *Attorney, Agent, or Firm*—Foley & Lardner LLP (57) ABSTRACT

A storage room for storing an attachment unit is provided with a plate for sheltering electrified portions inside the storage room from outside while the attachment unit is not stored in the storage room. A hook is also provided to maintain a state where the plate shelters the electrified portions. While the attachment unit is not stored in the storage room the hook protrudes into the storage room and is positioned at an area over the plate. When an external force is applied to the plate, the hook prevents the plate from being fallen down by the external force by hooking the plate thereon.

17 Claims, 14 Drawing Sheets

ELECTRONIC APPARATUS

BACKGROUND OF THE INVENTION

1. Field of the Invention

The present invention relates to an electronic apparatus,

2. Description of the Related Art

Electronic apparatuses such as computers used in companies, etc. tend to be kept in operation for twenty-four successive hours to meet customer demands. If such apparatus are out of service due to breakdowns, customers may experience serious problems.

Makers of electronic apparatuses deal with the above problem by preparing redundant units for principal attachment units to be attached to electronic apparatuses.

For example, makers design electronic apparatuses so that apparatus bodies can store two of each principal attachment unit. Therefore, even if one of the redundant units is damaged, the electronic apparatus can keep working with the other unit.

In this case, the damaged attachment unit is replaced with a new one while the electronic apparatus is kept working.

After the damaged attachment unit is removed from the body of the electronic apparatus, the location where this attachment unit was stored becomes a hollow slot. Connector pins, circuits, and other electrified portions through which electricity flows are exposed in this hollow slot.

If a replacement worker touches an electrified portion when reaching out his/her hand into the hollow slot, he/she might get an electric shock, or a short-circuit may occur causing malfunctioning of the electronic apparatus, a power-down, etc.

Safety standards organizations such as UL (UNDERWRITERS LABORATORIES INC.) in the United States impose regulations against such dangers.

Unexamined Japanese Patent Application KOKAI Publication No. H8-8259 discloses a technique for closing an opening of a hollow slot while an attachment unit is removed from the body of an electronic apparatus.

Figure 10:
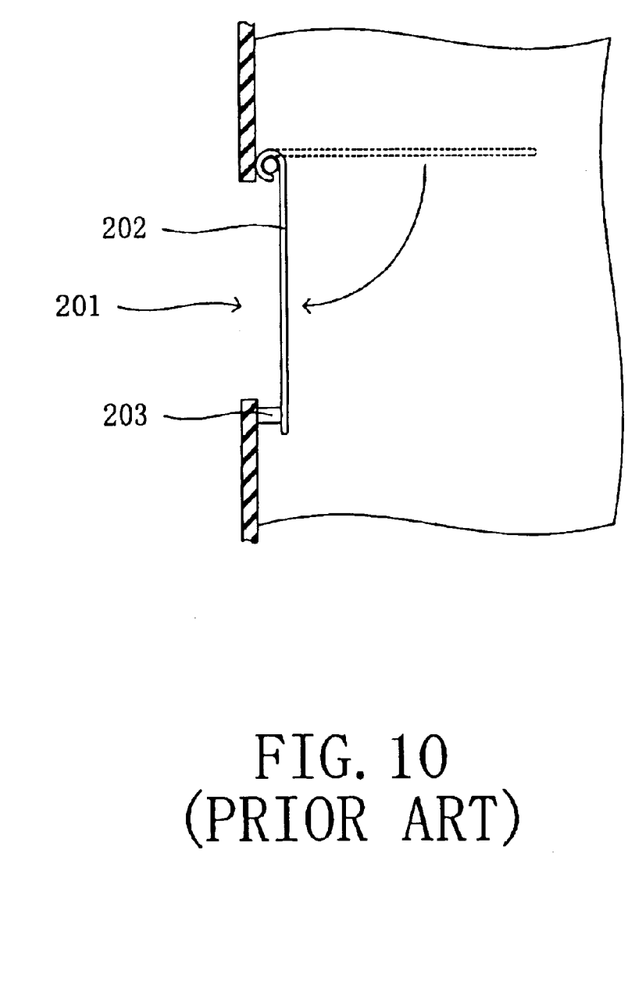
FIG. 10 is a diagram showing a conventional technique.

The technique of the above publication closes an opening 201 of a hollow with a shutter 202, as shown in FIG. 10. And the closing shutter 202 is attracted to the body by a permanent magneto 203.

The permanent magneto 203 is provided to prevent the shutter 202 from swinging due to wind caused by a cooling fan set inside the body. Therefore, the shutter 202 can be easily opened with a hand, and the like, In other words, even with the use of the technique disclosed in the above publication, the covering of the electrified portions by the shutter 202 can-not be maintained. Accordingly, the technique of the above publication can-not sufficiently prevent a hand or foreign materials from entering the hollow slot.

Thus, the technique of the above publication can-not prevent the occurrence of an electric shock, a short-circuit, a malfunction of the electronic apparatus, a power-down, etc. due to the invasion of a hand or foreign materials into the hollow slot.

The content of the above indicated Unexamined Japanese Patent Application KOKAI Publication No. H8-18259 is incorporated herein by reference in its entirety.

SUMMARY OF THE INVENTION

Accordingly, the object of the present invention is to provide an electronic apparatus in which attachment units can be replaced safely.

To achieve the above object, an electronic apparatus according to the present invention is an electronic apparatus having at least one storage room for storing an attachment unit, the apparatus comprising:

a shelter structure which shelters an electrified portion which is inside the at least one storage room from outside, in a case where the attachment unit is not stored in the at least one storage room; and a maintaining structure which maintains a state where the shelter structure shelters the electrified portion, in a case where the attachment unit is not stored in the at least one storage room, wherein: the shelter structure comprises a plate which is set inside the at least one storage room, for sheltering the electrified portion from outside; and the maintaining structure prevents the plate from shifting from a sheltering position at which the electrified portion can be sheltered from outside, by an externally applied force.

According to this invention, attachment units can be replaced safely.

The plate may swing on its one side, fall down in a case where the attachment unit is stored in the at least one storage room, and stand in a case where the attachment unit is not stored in the at least one storage room in order to shelter the electrified portion from outside.

The shelter structure may comprise a spring for standing up the plate in a case where the attachment unit is taken out from the at least one storage room.

The shelter structure may comprise a stopper which stops the plate being stood up by the spring at the sheltering position.

The maintaining structure may comprise a book which prevents the plate from being fallen down by an external force by hooking at least a part of the plate thereon.

The hook may be positioned at outside of an area over the plate in a case where the attachment unit is stored in the at least one storage room.

The hook may be set on a one end of a swinging member capable of swinging on its other end, may be positioned at the area over the plate by swinging of the swinging member in a case where the attachment unit is taken out from the at least one storage room, and may be displaced from the area over the plate in a case where the attachment unit is stored into the at least one storage room.

The maintaining structure may comprise a protrusion which is set at the middle of the swinging member, for controlling swinging of the swinging member.

The protrusion may be positioned in a path along which the attachment unit moves, in a case where the attachment unit is not stored in the at least one storage room.

The swinging member may swing when the protrusion is pushed outwardly from inside of the at least one storage room by the attachment unit, and thus cause the hook to be displaced from the area over the plate, in a case where the attachment unit is stored into the at least one storage room.

The swinging member may be formed of a plate spring, and cause the hook to be positioned at the area over the plate by swinging due to its own elasticity, in a case where the attachment unit is taken out from the at least one storage room.

The maintaining structure may comprise a cover plate which covers the protrusion positioned in the path of the attachment unit in order to prevent the protrusion from being pushed by mistake.

The hook may be positioned at the area over the plate after the plate shelters the electrified portion, in a case where the attachment unit is taken out from the at least one storage room.

The plate may be fallen down by the attachment unit after the hook is displaced from the area over the plate, in a case where the attachment unit is stored into the at least one storage room.

The plate may be a meshed plate.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

A structure of a body of an electronic apparatus according to an embodiment of the present invention will now be explained with reference to the drawings.

In the following descriptions, an electronic apparatus shown in FIG. 1 will be employed as an example for explaining the present invention.

Figure 1:
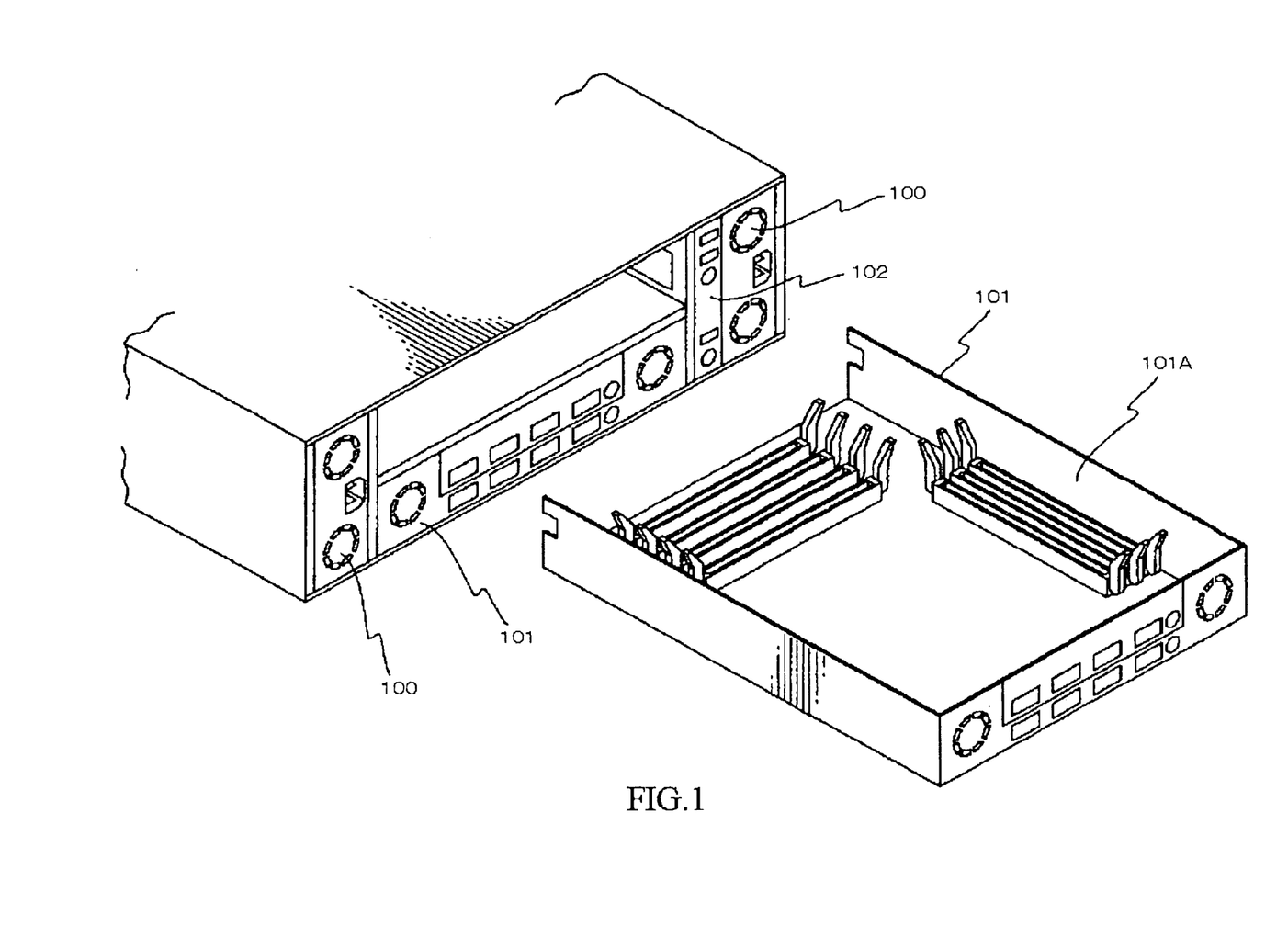
FIG. 1 is a perspective view or an electronic apparatus according to an embodiment of the present invention.

As shown in FIG. 1, the electronic apparatus comprises two power source units 100, two control card units 101, and a communication card unit 102, as attachment units.

Figure 2:
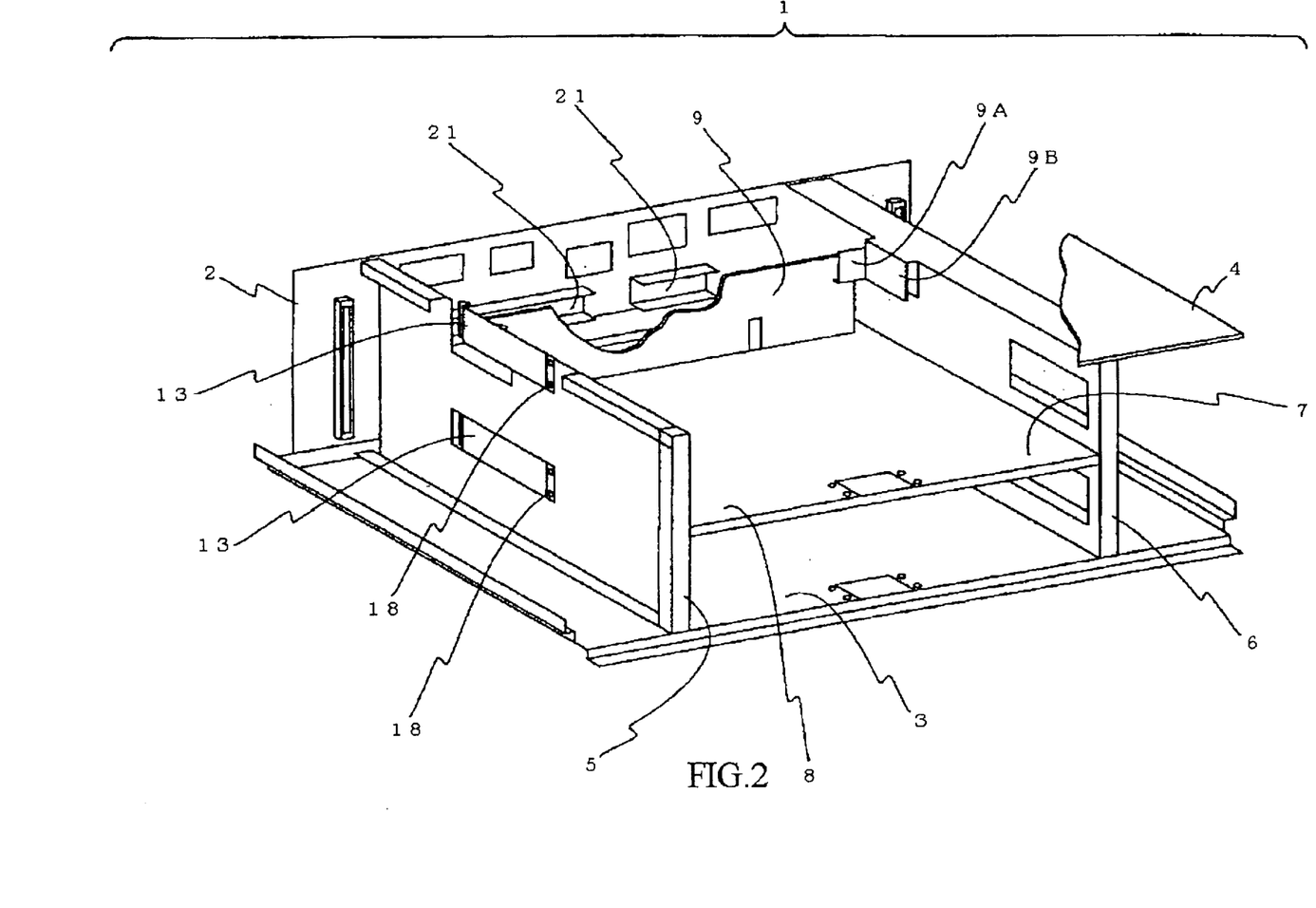
FIG. 2 is a perspective view showing the inside of the body of the electronic apparatus shown in FIG. 1.

The body 1 into which the attachment units 100, 101, and 102 are stored comprises a main substrate 2, a bottom plate 3, a top plate 4, vertical partitions 5 and 6, and a horizontal partition 7, as shown in FIG. 2.

The bottom plate 3 and the top plate 4 are arranged in parallel with each other with a predetermined distance between them, and perpendicularly to the main substrate 2.

The vertical partitions 5 and 6 are arranged in parallel with each other with a predetermined distance between them, and perpendicularly to the main substrate 2, the bottom plate 3, and the top plate 4.

The horizontal partition 7 is arranged between the bottom plate 3 and the top plate 4 in parallel with the bottom plate 3 and the top plate 4. Due to this arrangement, the horizontal partition 7 divides the space surrounded by the main substrate 2, the bottom plate 3, the top plate 4, and the vertical partitions 5 and 6 into two.

Storage rooms into which the attachment units 100, 101, and 102 are stored are formed by partitioning the space inside the body 1 with the main substrate 2, the bottom plate 3, the top plate 4, the vertical partitions 5 and 6, and the horizontal partition 7.

Each storage room is provided with a structure for sheltering elected portions from outside, which are exposed in the room while the attachment unit is taken out from the room, and also with a structure for maintaining the sheltering state while the attachment unit is taken out from the room.

The electrified portions are connectors, circuits, and the like, through which electricity is flowing. As examples of electrified portions, FIG. 2 shows connectors 21 mounted on the main substrate 2.

The detailed structure inside the body 1 will be explained below by employing one of storage rooms for storing the control card units 101 (the storage room 8) as an example.

The storage room or storage slot 8 is formed by the main substrate 2, the top plate 4, the vertical partitions 5 and 6, and the horizontal partition 7, as shown in FIG. 2.

(1) Structure for Sheltering Electrified Portions from Outside

First, the structure for sheltering the electrified portions from outside will be explained.

Figure 3A:
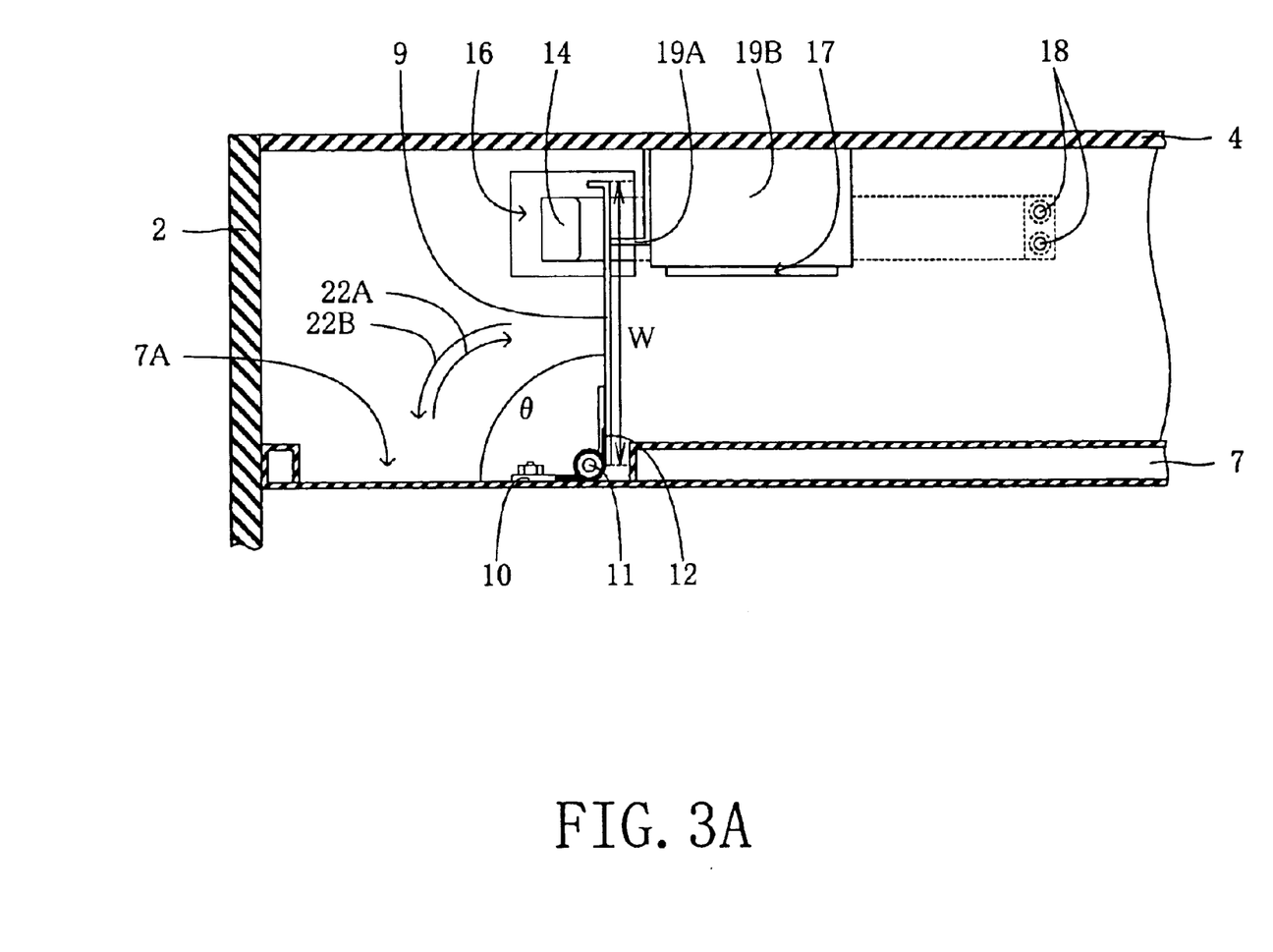
FIGS. 3A and 3B are cross sections of the body shown in FIG. 2.
Figure 3B:
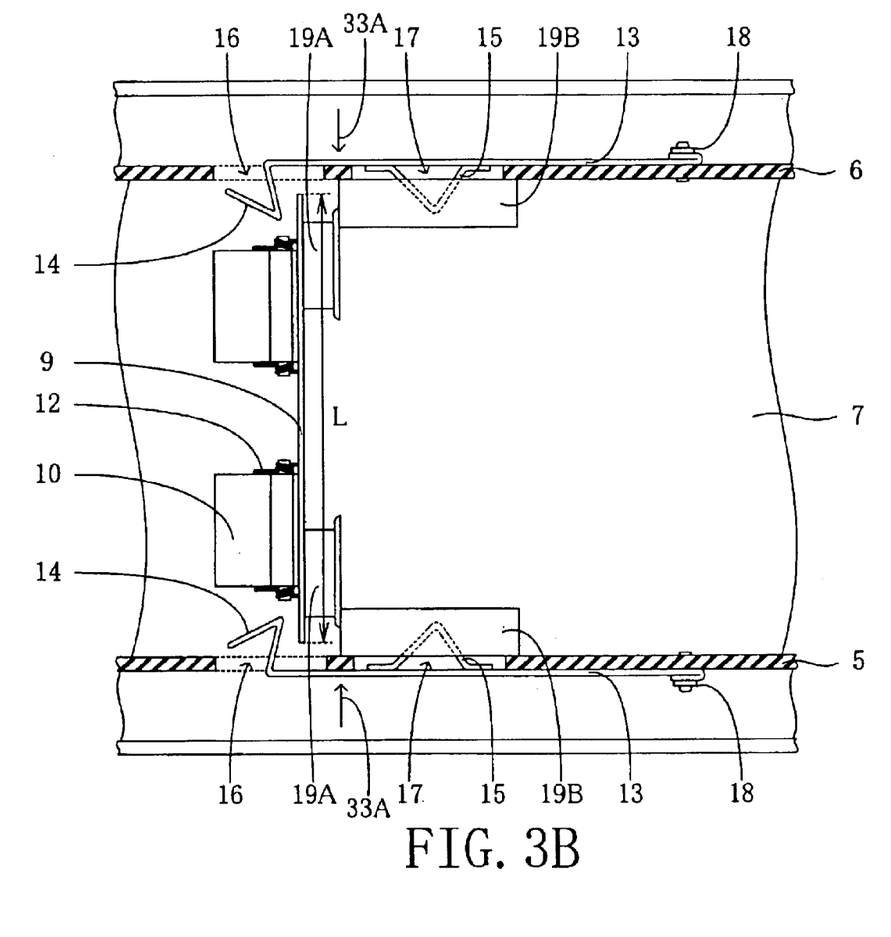

FIG. 3A is a cross section showing a part of the storage room 8 when the body 1 shown in FIG. 2 is severed in parallel with the vertical partitions 5 and 6. FIG. 3B is a cross section showing a part of the storage room 8 when the body shown in FIG. 2 is severed in parallel with the top plate 4 and the horizontal partition 7.

As shown in FIG. 3A, the horizontal partition 7 comprises near the main substrate 2, a cut-open portion 7A which stores a shelter plate 9 for sheltering the electrified portions from outside.

The shelter plate 9 is jointed at its one side to the cut-open portion 7A by a hinge 10 so as to swing in directions indicated by arrows 22A and 22B in FIG. 3A. A swing shaft 11 of the hinge 10 is provided with a coil spring 12 for applying a force to the shelter plate 9 to arise in the direction of the arrow 22A.

The shelter plate 9 is stored in the cut-open portion 7A by a push of the control card unit 101, when the control card unit 101 is to be stored in the storage room 8. On the other hand, when the control card unit 101 is to be removed from the storage room 8, the shelter plate 9 swings up on the swing shaft 11 from the innermost portion of the storage room 8 toward the front thereof, i.e., in the direction of the arrow 22A by the elasticity of the coil spring 12.

Each of the vertical partitions 5 and 6 comprises a stopper 19A for stopping the shelter plate 9 swung by the coil spring 12 at a predetermined sheltering position, as shown in FIGS. 3A and 3B.

Due to this, while the control card unit 101 is taken out from the storage room 8, the shelter plate 9 stops at the sheltering position and shelters the electrified portions from outside; in order to prevent the electrified portions from being touched by a hand or foreign materials coming from outside into the storage room 8, The length L, width W, and sheltering position of the shelter plate 9 are set within a range enough to prevent passing of a hand and foreign materials.

For example, if the length L and width W of the shelter plate 9 are too small, there are formed spaces at the sides and over the top of the shelter plate 9 that let in a hand and foreign materials, even when the shelter plate 9 is set in the right sheltering position. On the other hand, if the length L and width W of the shelter plate 9 are too large, the shelter plate 9 can not swing in the storage room 8.

Further, if the angle θ formed between the shelter plate 9 and the horizontal partition 7 is too large or too small, a space is generated above the shelter plate 9 that allows a hand and foreign materials to pass through. FIG. 3A shows a case where the angle θ is at the most favorable degrees to prevent passing of a hand and foreign materials, i.e., at 90 degrees.

In consideration of the above conditions, the length L, width W, sheltering position of the shelter plate 9 are set in advance, through theoretical computing and tests.

(2) Structure for Maintaining Shelter

Next, the structure for maintaining the state where the electrified portions are sheltered by the shelter plate 9 will be explained.

As described above, while the control card unit 101 is taken out from the storage room 8, the electrified portions are sheltered from outside by the shelter plate 9. However, by simply pushing the shelter plate 9 against the stoppers 19A by the coil spring 12, the shelter plate 9 might be fallen down by a hand or foreign materials coming into the storage room 8 from outside. If the shelter plate 9 is fallen down, it can not prevent the hand or foreign materials from touching the electrified portions.

To avoid this, each of the vertical partitions 5 and 6 comprises a swinging member 13 for preventing the shelter plate 9 being at the sheltering position from being fallen down by a hand or foreign materials.

Each swinging member 13 is arranged at the outer side of the storage room 8, with its one end toward the innermost side of the storage room 8 and its other end toward the front of the storage room 8. The height at which the swinging member 13 is positioned is set at the upper side of the storage room 8. The other end of the swinging member 13 is fixed on the vertical partition 5 or 6, with a vis or a rivet 18. The swinging member 13 is formed of a plate spring, and swings on the other end fixed by the vis or rivet 18.

The swinging member 13 is provided at the one end with a hook 14 for preventing the shelter plate 9 from being fallen down when pushed by a hand or foreign materials, by hooking the shelter plate 9 thereon. The swinging member 13 comprises at its middle portion, a wedge-like protrusion 15 for controlling swinging of the swinging member 13 when the control card unit 101 is stored in the storage room 8.

Each of the vertical partitions 5 and 6 comprises a hole 16 which permits the hook 14 to protrude into the storage room 8, and a hole 17 which permits the wedge-like protrusion 15 to protrude into the storage room 8.

The hook 14 and the wedge-like protrusion 15 protrude into the storage room 8 through the hole 16 and the bole 17 respectively, while the control card unit 101 is taken out from the storage room 8.

The hook 14 and the wedge-like protrusion 15 are positioned when they are protruding, such that the shelter plate 9 set at the sheltering position comes between the hook 14 and the wedge-like protrusion 15.

Further, the hook 14 is positioned to protrude such that the shelter plate 9 can prevent passing of a hand or foreign materials even when the shelter plate 9 contacts the hook 14. In other words, the hook 14 is positioned to protrude such that no spaces are generated around the shelter plate 9 that allow a hand or foreign materials to pass through, even when the shelter plate 9 contacts the hook 14.

In a case where the control card unit 101 is stored in the storage room 8, the wedge-like protrusion 15 is pushed out of the storage room 8 by a side wall 101A of the control card unit 101. Due to this, the swinging member 13 swings outwardly from the storage room 8, and the hook 14 is displaced from an area over the shelter plate 9. Therefore, the shelter plate 9 can be pushed down by the control card unit 101.

On the other hand, in a case where the control card unit 101 is taken out from the storage room 8, the swinging member 13 swings on the other end thereof from the outside of the storage room 8 to the inside thereof, i.e., in a direction indicated by an arrow 33A shown in FIG. 3B, by its elasticity. Due to this, the hook 14 and the wedge-like protrusion 15 protrude into the storage room 8 through the holes 16 and 17 respectively.

Due to the above structure, even if the shelter plate 9 being at the sheltering position is pushed by a hand or foreign materials, it does not fall down because it is hooked on the hook 14. Further, the direction of the force applied to the hook 14 when the shelter plate 9 is pushed is parallel to the swinging member 13. Therefore, even if the shelter plate 9 is pushed by a large force, the swinging member 13 is free from damages.

Each of the vertical partitions 5 and 6 comprises a cover plate 19B for preventing the wedge-like protrusion 15 protruding into the storage room 8 from being pushed by a hand or foreign materials.

As shown in FIGS. 3A and 3B, the cover plate 19B is arranged so as to cover the hole 17, i.e., the wedge-like protrusion 15 protruding into the storage room 8.

Figure 4:
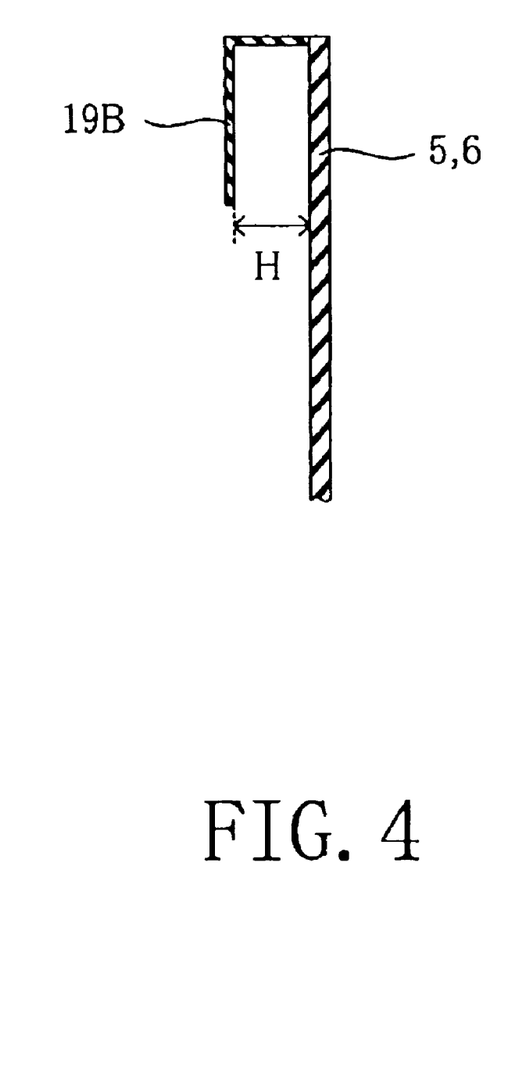
FIG. 4 is a diagram showing a shape of a cross section of a cover plate provided inside the body.

The cross section of the cover plate 19B is an "L" shape, as shown in FIG. 4. And a distance H between the cover plate 19B and the vertical partition 5 or 6 is set so as to have a length which is larger than the thickness of the side wall 101A of the control card unit 101, and which is smaller than the thickness of a finger, etc.

Thus, when the control cad unit 101 is stored into the storage room 8, the side wall 101A of the control card unit 101 passes through between the cover plate 19B and the vertical partition 5 or 6 and pushes the wedge-like protrusion 15 out of the storage room 8.

When the control card unit 101 is not stored in the storage room 8, the cover plate 19B can prevent the wedge-like protrusion 15 from being pushed out of the storage room 8 by a hand or foreign materials.

The cover plate 19B is arranged at the upper side of the storage room 8, in accordance with the height at which the swinging member 13 is arranged. Therefore, when the control card unit 101 is stored into the storage room 8, the cover plate 19B does not collide with electronic components mounted on the control card unit 101.

By providing the above described cover plate 19B, it is possible to securely prevent the shelter for the electrified portions built up by the shelter plate 9 from being destroyed by a hand or foreign materials.

Next, the structure for sheltering the electrified portions from outside and the structure for maintaining the shelter will be explained in more detail, with respect to a case where the control card unit 101 is taken out from the storage room 8, and to a case where the control card unit 101 is stored into the storage room 8.

Figure 5A:
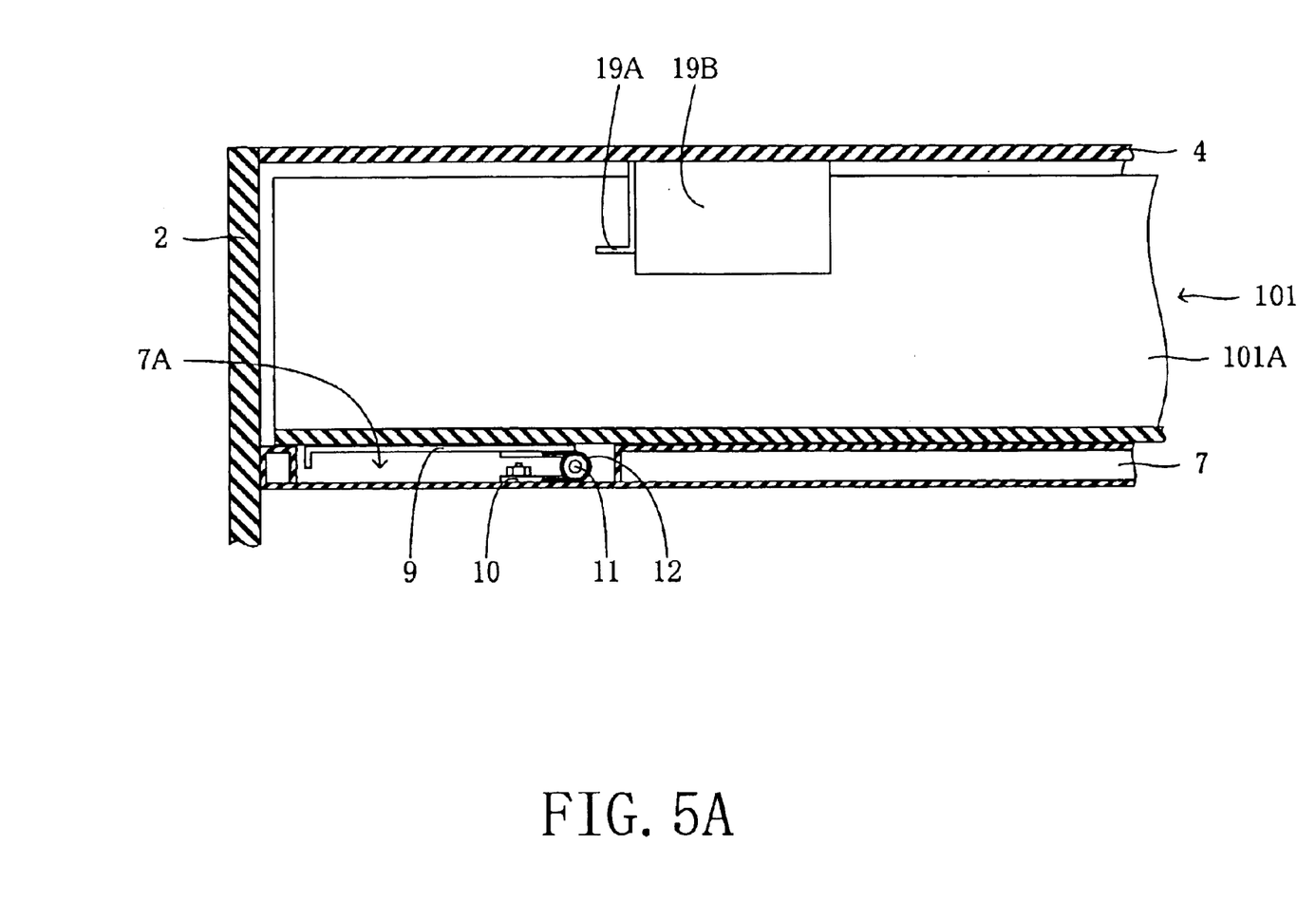
FIGS. 5A and 5B are cross sections showing a state where an attachment unit is stored in the body of the electronic apparatus.
Figure 5B:
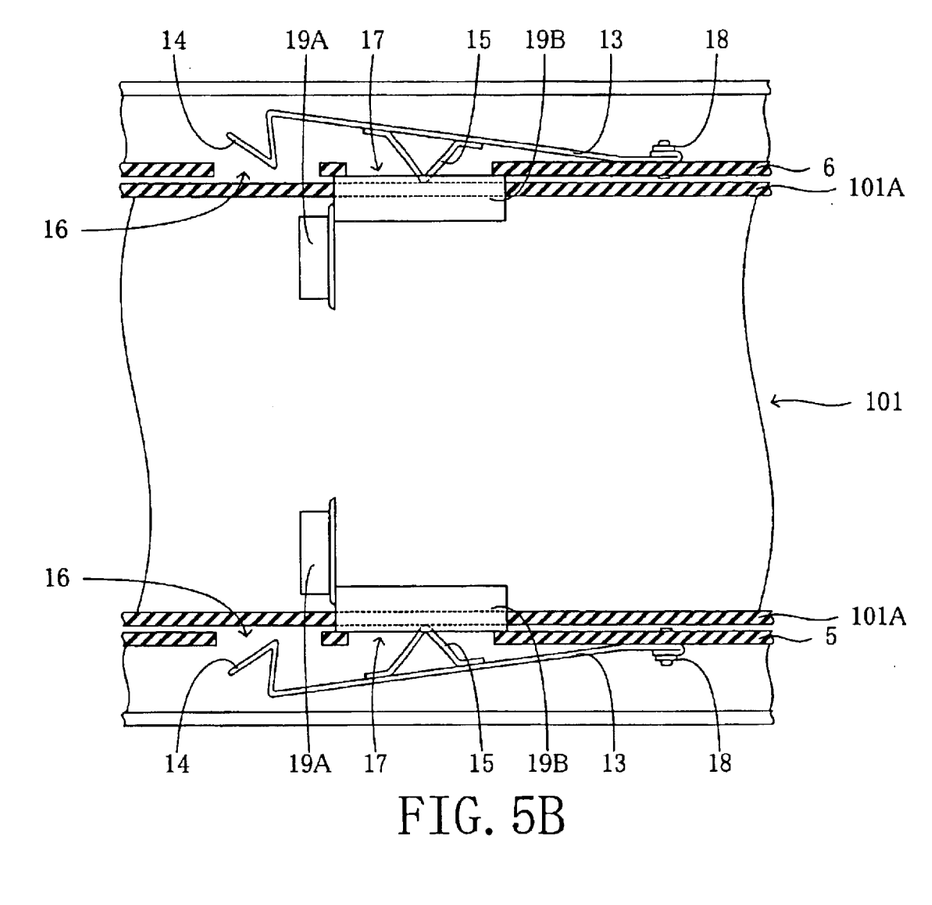

FIGS. 5A and 5B are cross sections showing a state where the control card unit 101 is stored in the storage room 8.

Figure 6A:
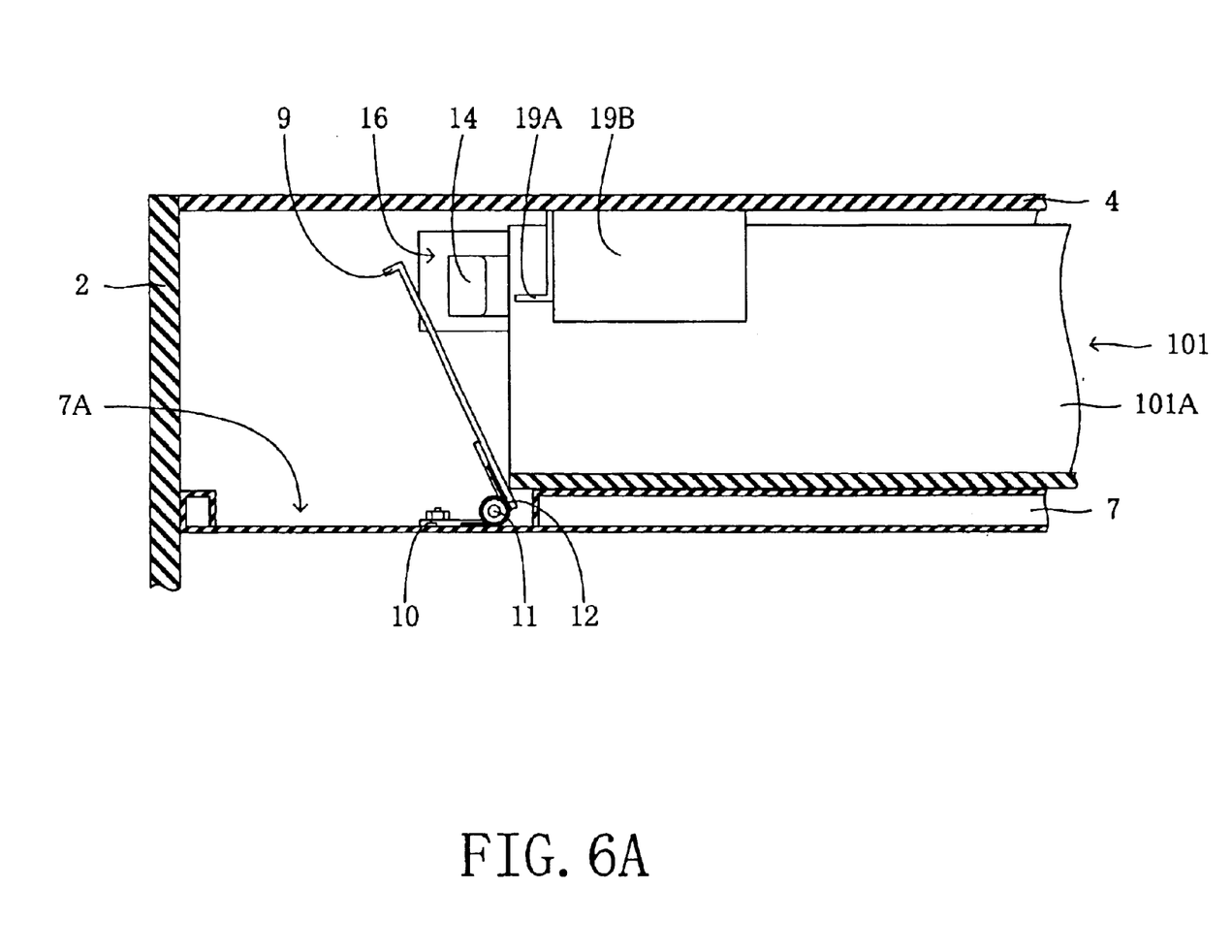
FIGS. 6A and 6B are cross sections showing a state where the attachment unit is being taken out from the body.
Figure 6B:
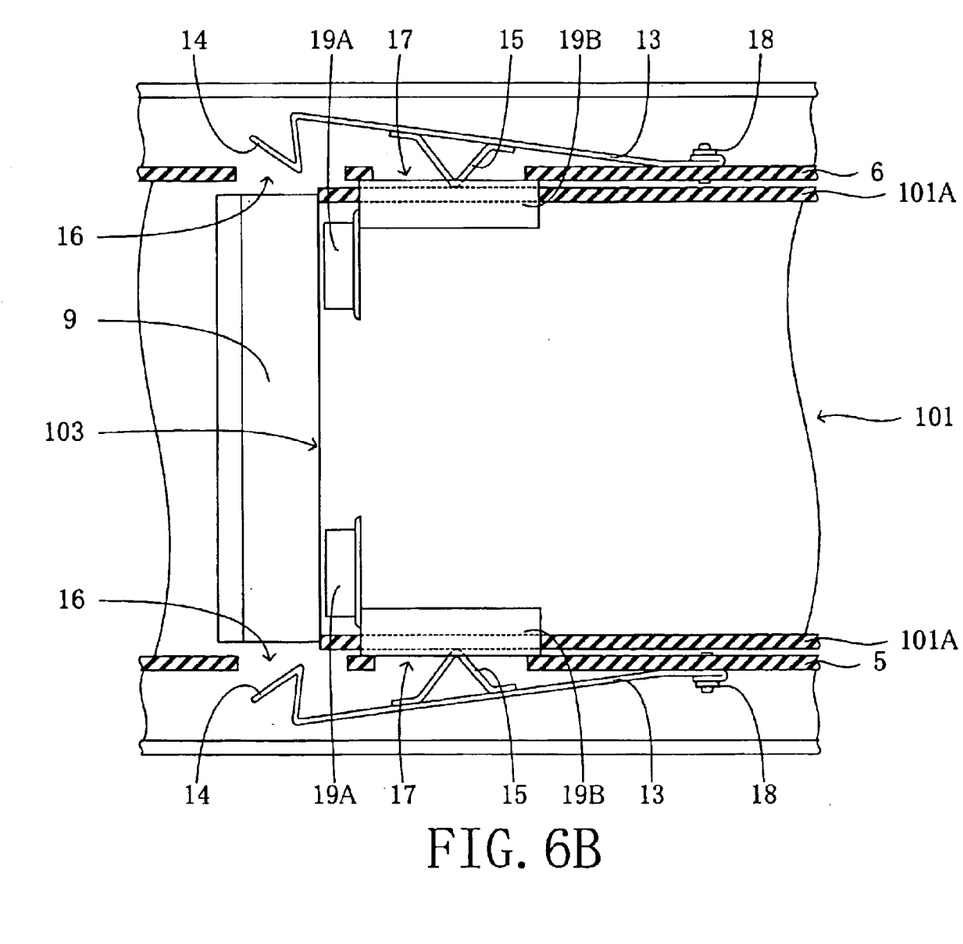

FIGS. 6A and 6B are cross sections showing a state where the control card unit 101 is in the process of being taken out from the storage room 8, and the shelter plate 9 is swinging.

Figure 7A:
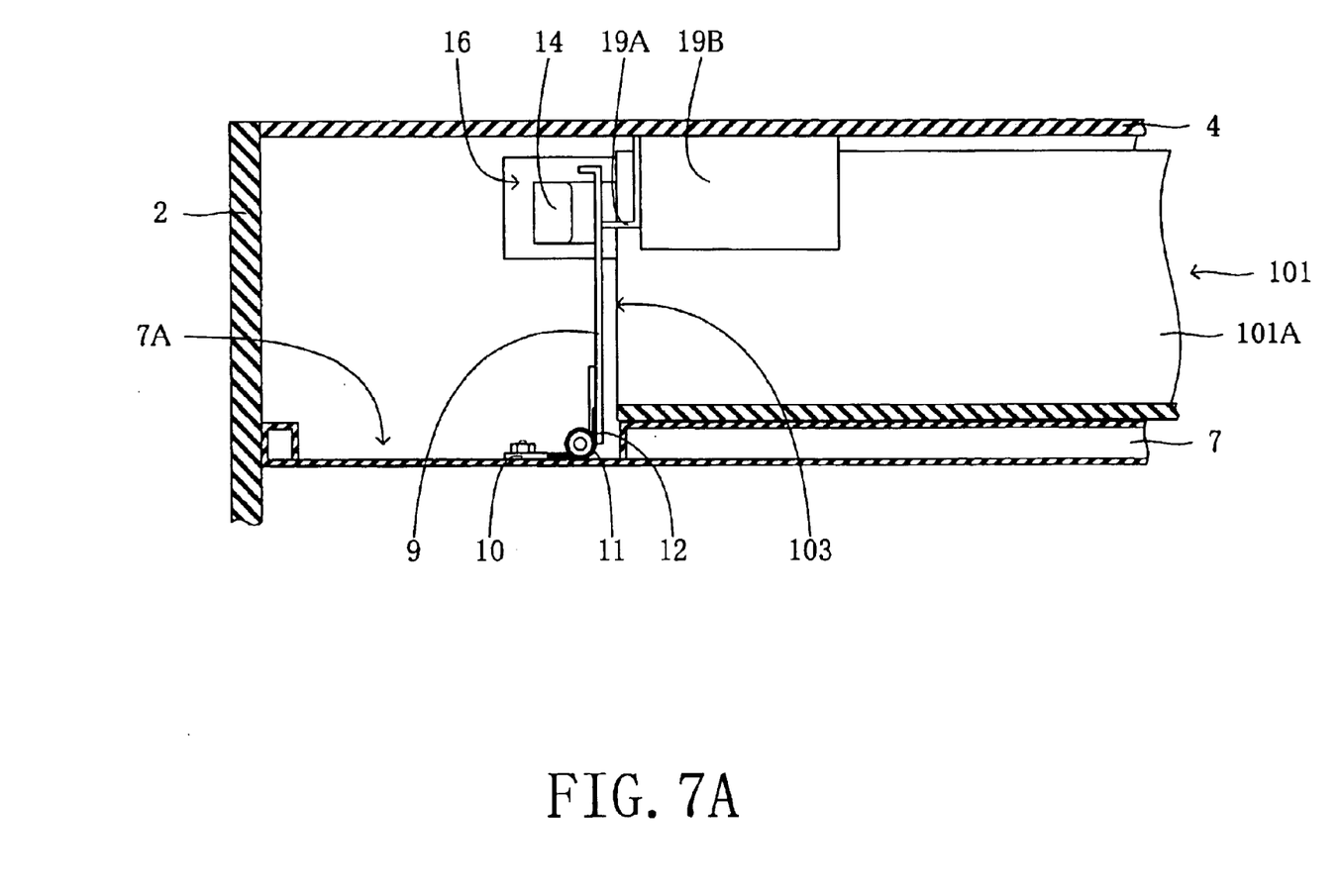
FIGS. 7A and 7B are cross sections showing a state where the attachment unit is being taken out from the body.
Figure 7B:
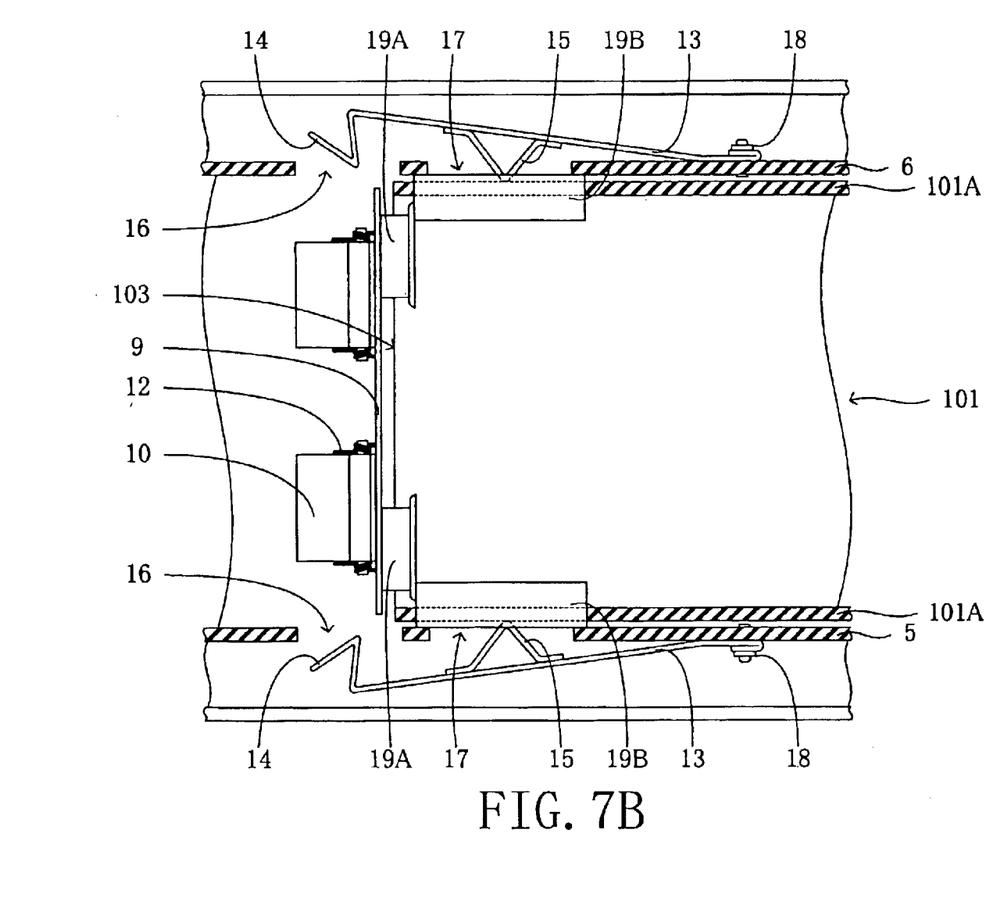

FIGS. 7A and 7B are cross sections showing a state where the control card unit 101 is in the process of being taken out from the storage room 8, and the shelter plate 9 stands at the sheltering position.

In a case where the control card unit 101 is stored in the storage room 8, the shelter plate 9 is pushed by the control card unit 101 and stored into the cut-open portion 7A of the horizontal partition 7, as shown in FIGS. 5A and 5B. And the hook 14 and the wedge-like protrusion 15 are pushed out of the storage room 8 by the side wall 101A of the control card unit 101.

When the control card unit 101 starts being taken out from the storage room 8, the shelter plate 9 swings up on the swing shaft 11 by the elasticity of the coil spring 12, as shown in FIGS. 6A and 6B.

Then, when the control card unit 101 is further drawn out and an end 103 of the control card unit 101 passes by the position at which the stopper 19A is set, swinging of the shelter plate 9 is stopped by the stopper 19A, as shown in FIGS. 7A and 7B. Due to this, the shelter plate 9 is set at the sheltering position.

At the stage shown in FIGS. 7A and 7B, the side wall 101A of the control card unit 101 covers the hole 17. Thus, the hook 14 and the wedge-like protrusion 15 are outside of the storage room 8.

Then, when the end 103 of the control card unit 101 passes by the position at which the wedge-like protrusion 15 protrudes, the hook 14 and the wedge-like protrusion 15 protrude into the storage room, 8 through the holes 16 and 17 by the elasticity of the swinging member 13, as shown in FIGS. 3A and 3B. Thus, the shelter plate 9 set at the sheltering position is prevented from being pushed down by a hand or foreign materials.

In a case where the control card unit 101 is stored into the storage room 8, the structure for sheltering the electrified portions from outside and the structure for maintaining the shelter work in the reverse way.

Specifically, when the end 103 of the control card unit 101 to be stored into the storage room 8 comes to the position from which the wedge-like protrusion 15 protrudes, the wedge-like protrusion 15 is pushed out of the storage room 8 by the side wall 101A of the control card unit 101. Thus, the hook 14 is displaced from an area over the shelter plate 9, and the shelter plate 9 therefore can be pushed down by the control card unit 101, as shown in FIGS. 7A and 7B.

When the control card unit 101 is further moved, the shelter plate 9 is pushed down by the control card unit 101, as shown in FIGS. 6A and 6B. At this time, since the hook 14 is let out from the storage room 8, the shelter plate 9 can be easily pushed down by the control card unit 101.

Afterwards, as shown in FIGS. 5A and 5B, the shelter plate 9 is stored in the cut-open portion 7A of the horizontal partition 7, and the control card unit 101 is connected to the connectors 21 of the main substrate 2.

As described above, while the control card unit 101 is taken out from the storage room 8, it is possible to securely prevent the electrified portions from being touched by a hand or foreign materials coming into the storage room 8, by the structure for sheltering the electrified portions from outside and the structure for maintaining the shelter. Therefore, while the control card unit 101 is taken out from the storage room 8, an electric shock, a short-circuit, malfunctioning of the electronic apparatus, and power-down which might be caused due to invasion of a hand or foreign materials, can be prevented without fail. Accordingly, replacement for the control card unit 101 can be carried out safely.

In the above-described embodiment, a case where the shelter plate 9 stands on the horizontal partition 7, is explained as an example. Instead, the shelter plate 9 may be arranged on the top plate 4, the vertical partition 5, or the vertical partition 6. Thus, the shelter plate 9 may shelter the electrified portions from outside by standing on the top plate 4, the vertical partition 5, or the vertical partition 6.

In a case where the shelter plate 9 is arranged on the vertical partition 5 or the vertical partition 6, the swinging members 13 may be set on the top plate 4 and the horizontal partition 7, respectively, Further, in a case where the shelter plate 9 is arranged on the horizontal partition 7, the swinging members 13 may be set on the top plate 4.

Figure 8:
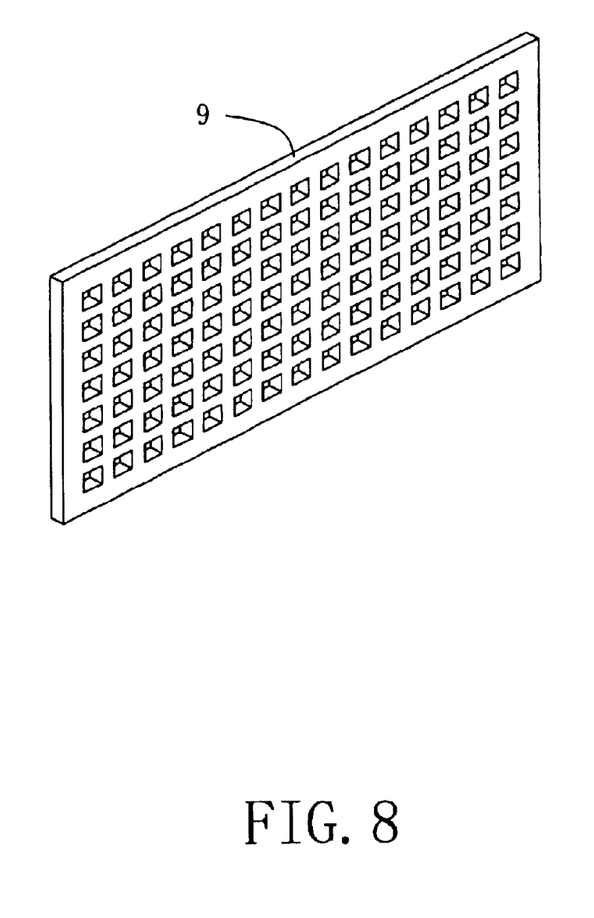
FIG. 8 is a diagram showing another example of a shelter plate set inside the body.

The shelter plate 9 may be a meshed plate as shown in FIG. 8, as long as it can prevent passing of a hand or foreign materials. In this case, each of the plurality of meshes of the shelter plate 9 is sized so as not to allow passing of a hand (finger) or foreign materials. With those meshes, it is possible to prevent the electrified portions from being touched by a hand or foreign materials, and at the same time, to discharge heated air around the electrified portions to outside easily.

Further, as described above, in a case where the control card unit 101 is taken out from the storage room 8, the shelter plate 9 is set on the sheltering position first, and afterwards, the hook 14 comes around to the shelter plate 9. In a case where the control card unit 101 is stored into the storage room 8, the hook 14 is displaced from an area over the shelter plate 9 first, and afterwards, the shelter plate 9 is fallen down. In view of those facts, either of the elasticity of the coil spring 12 and the elasticity of the swinging member 13 may be stronger than the other, or both of them may be equal.

Further, the coil spring 12 may get slack to the full when angle θ formed between the shelter plate 9 and the horizontal partition 7 is almost 90 degrees. With the use of the coil spring 12 of this kind, the swinging of the shelter plate 9 stops when the angle θ becomes about 90 degrees, even without the stopper 19A.

Figure 9A:
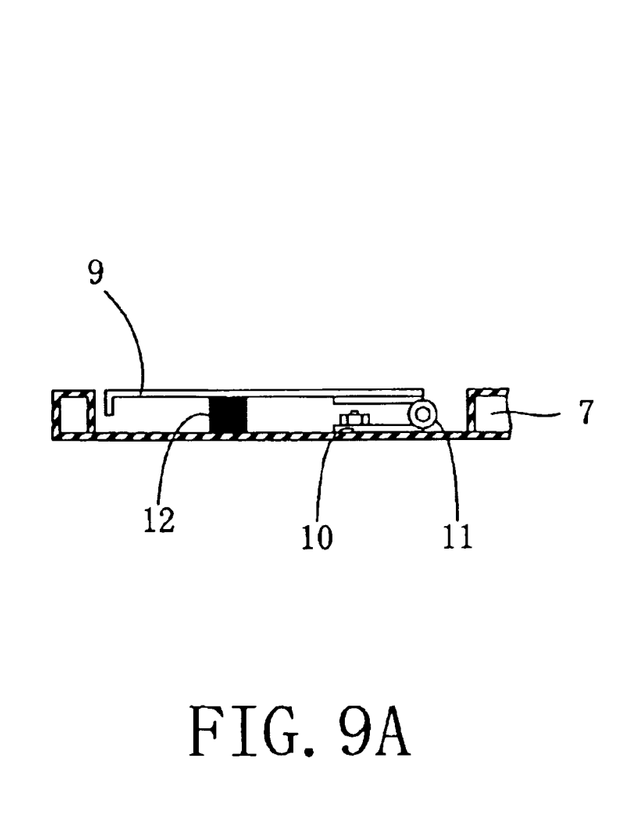
FIGS. 9A and 9B are diagrams showing another example of how to set a spring for swinging the shelter plate.
Figure 9B:
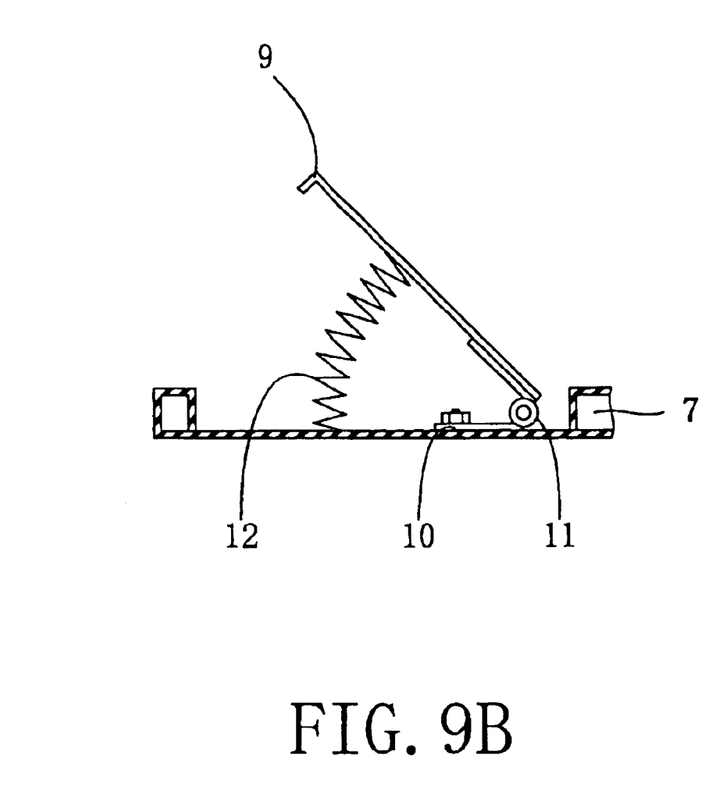

Further, the coil spring 12 may be set other than on the swing shaft 11 described above. For example, as shown in FIGS. 9A and 9B, the coil spring 12 may be arranged as sandwiched between the horizontal partition 7 and the shelter plate 9.

Further, the swinging member 13 may not be formed of a plate spring In this case, the swinging member 13 may be provided with a spring for applying a force in the direction indicated by the arrow 33A in the FIG. 3B to the hook 14 and the wedge-like protrusion 15.

Further, the explanation has been made so far by employing the storage room 8 as an example. However, other storage rooms are also provided with the same structures as above, respectively.

Further, the present invention can be applied to anything as long as it is an electronic apparatus comprising storage rooms for detachably storing attachment units. For example, the present invention can be applied to not only an ordinary computer, but also to a game console, a facsimile machine, a copier, a printer, etc.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2001-386042 filed on Dec. 19, 2001 and including specification, claims, drawings and summary. The disclosure of the above Japanese Patent Application is incorporated herein by reference in its entirety,

What is claimed is:

1. An electronic apparatus having at least one storage slot for storing an attachment unit, said apparatus comprising:

a shelter structure which shelters an electrified portion which is inside said at least one storage slot from outside when said attachment unit is not stored in said at least one storage slot; and a maintaining structure which maintains a state where said shelter structure shelters said electrified portion when said attachment unit is not stored in said at least one storage slot, wherein said shelter structure comprises a plate which is set inside said at least one storage slot, for sheltering said electrified portion from outside; and wherein said maintaining structure prevents said plate from shifting, by direct contact with a user's hand, from a sheltering position at which said electrified portion is sheltered from outside.

2. The electronic apparatus according to claim 1, wherein said plate swings on one of its sides, falls down when said attachment unit is stored in said at least one storage slot, and stands up when said attachment unit is not stored in said at least one storage slot in order to shelter said electrified portion from outside.

3. The electronic apparatus according to claim 2, wherein said shelter structure further comprises a spring for standing up said plate when said attachment unit is removed from said at least one storage slot.

4. The electronic apparatus according to claim 3, wherein said shelter structure further comprises a stopper which stops said plate being stood up by said spring at the sheltering position.

5. The electronic apparatus according to claim 2, wherein said maintaining structure comprises a hook which prevents said plate from falling down when an external force is applied on said plate, by hooking at least a part of said plate.

6. The electronic apparatus according to claim 5, wherein said hook is positioned outside of an area over said plate when said attachment unit is stored in said at least one storage slot.

7. The electronic apparatus according to claim 6, wherein said hook is set on one end of a swinging member capable of swinging on its other end, is positioned in the area over said plate by swinging of said swinging member when said attachment unit is removed from said at least one storage slot, and is displaced from the area over said plate when said attachment unit is stored into said at least one storage slot.

8. The electronic apparatus according to claim 7, wherein said maintaining structure comprises a protrusion which is set at the middle of said swinging member, for controlling swinging of said swinging member.

9. The electronic apparatus according to claim 8, wherein said protrusion is positioned in a path along which said attachment unit moves when said attachment unit is not stored in said at least one storage slot; and wherein said swinging member swings when said protrusion is pushed outwardly from inside of said at least one storage slot by said attachment unit, thus causing said hook to be displaced from the area over said plate when said attachment unit is stored into said at least one storage slot.

10. The electronic apparatus according to claim 9, wherein said swinging member is formed of a plate spring and causes said hook to be positioned in the area over said plate, by swinging due to its own elasticity, when said attachment unit is removed from said at least one storage slot.

11. The electronic apparatus according to claim 9, wherein said maintaining structure comprises a cover plate which covers said protrusion positioned in the path of said attachment unit in order to prevent said protrusion from being pushed by mistake.

12. The electronic apparatus according to claim 7, wherein said hook is positioned in the area over said plate after said plate shelters said electrified portion when said attachment unit is removed from said at least one storage slot.

13. The electronic apparatus according to claim 7, wherein said plate is pushed down by said attachment unit after said hook is displaced from the area over said plate when said attachment unit is stored into said at least one storage slot.

14. The electronic apparatus according to claim 1, wherein said plate is a meshed plate.

15. An electronic apparatus having at least one storage slot for storing an attachment unit, said apparatus comprising:

a means for sheltering an electrified portion which is inside said at least one storage slot from outside when said attachment unit is not stored in said at least one storage slot; and a means for maintaining a state where said means for sheltering shelters said electrified portion when said attachment unit is not stored in said at least one storage slot, said maintaining means preventing said sheltering means from exposing said electrified portion upon direct contact with a user's hand.

16. A method for preventing access by foreign objects into an electrified portion of a storage slot of an electronic apparatus, the method comprising the steps of:

providing a sheltering member;

fixing the sheltering member in a sheltering position to shelter the electrified portion of the storage slot when an attachment unit is not stored in the storage slot;

securing the sheltering member in the sheltering position, even against force exerted by direct contact from a user's hand, when the attachment unit is not stored in the storage slot; and allowing the sheltering member to move from the sheltering position when the attachment unit is inserted into the storage slot.

17. An electronic apparatus including an attachment unit and having at least one storage slot for storing said attachment unit, said electronic apparatus comprising:

a means for sheltering an electrified portion which is inside said at least one storage slot from outside when said attachment unit is not stored in said at least one storage slot; and a locking mechanism for locking and unlocking said sheltering means;

wherein said attachment unit comprises an actuating mechanism for actuating said locking mechanism to lock said sheltering means in a sheltering position when said attachment unit is removed from said at least one storage slot and for actuating said locking mechanism to unlock said sheltering means when said attachment unit is inserted into said at least one storage slot.

* * * * *